(12) United States Patent
Ramaswamy et al.

(10) Patent No.: US 8,394,683 B2
(45) Date of Patent: Mar. 12, 2013

(54) METHODS OF FORMING SEMICONDUCTOR CONSTRUCTIONS, AND METHODS OF FORMING NAND UNIT CELLS

(75) Inventors: D. V. Nirmal Ramaswamy, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 248 days.

(21) Appl. No.: 12/014,508

(22) Filed: Jan. 15, 2008

(65) Prior Publication Data

US 2009/0180324 A1 Jul. 16, 2009

(51) Int. Cl.
*H01L 21/8247* (2006.01)
*H01L 27/115* (2006.01)

(52) U.S. Cl. ... 438/142; 438/149; 438/257; 257/E21.68; 257/321

(58) Field of Classification Search .......... 438/257–267; 257/314–321
See application file for complete search history.

(56) References Cited

U.S. PATENT DOCUMENTS

| | | | |
|---|---|---|---|
| 4,103,312 A * | 7/1978 | Chang et al. | 257/15 |
| 6,121,679 A * | 9/2000 | Luvara et al. | 257/700 |
| 6,335,554 B1 | 1/2002 | Yoshikawa | |
| 6,727,544 B2 | 4/2004 | Endoh et al. | |
| 6,773,968 B1 * | 8/2004 | Forbes et al. | 438/135 |
| 6,841,813 B2 | 1/2005 | Walker et al. | |
| 6,881,994 B2 * | 4/2005 | Lee et al. | 257/296 |
| 6,897,514 B2 | 5/2005 | Kouznetsov et al. | |
| 6,992,349 B2 | 1/2006 | Lee et al. | |
| 7,115,476 B1 | 10/2006 | Izumida | |
| 7,129,538 B2 | 10/2006 | Lee et al. | |
| 7,250,646 B2 | 7/2007 | Walker et al. | |
| 7,378,702 B2 | 5/2008 | Lee | |
| 7,525,137 B2 | 4/2009 | Walker et al. | |
| 2001/0024841 A1 * | 9/2001 | Noble et al. | 438/138 |
| 2002/0028541 A1 | 3/2002 | Lee et al. | |
| 2002/0142546 A1 | 10/2002 | Kouznetsov et al. | |

(Continued)

FOREIGN PATENT DOCUMENTS

| | | |
|---|---|---|
| EP | 0190 070 B1 | 1/1986 |
| JP | 2003-78044 A | 3/2003 |
| JP | 2007-317874 * | 6/2007 |
| WO | WO 02/15277 | 2/2002 |

(Continued)

OTHER PUBLICATIONS

PCT/US2008/084683, May 25, 2009, PCT Written Opinion of the ISA.

(Continued)

*Primary Examiner* — Julio J Maldonado
*Assistant Examiner* — Mohammad Choudhry
(74) *Attorney, Agent, or Firm* — Wells St. John P.S.

(57) ABSTRACT

Some embodiments include methods of forming semiconductor constructions. Alternating layers of n-type doped material and p-type doped material may be formed. The alternating layers may be patterned into a plurality of vertical columns that are spaced from one another by openings. The openings may be lined with tunnel dielectric, charge-storage material and blocking dielectric. Alternating layers of insulative material and conductive control gate material may be formed within the lined openings. Some embodiments include methods of forming NAND unit cells. Columns of alternating n-type material and p-type material may be formed. The columns may be lined with a layer of tunnel dielectric, a layer of charge-storage material, and a layer of blocking dielectric. Alternating layers of insulative material and conductive control gate material may be formed between the lined columns. Some embodiments include semiconductor constructions, and some embodiments include NAND unit cells.

12 Claims, 17 Drawing Sheets

U.S. PATENT DOCUMENTS

| | | | |
|---|---|---|---|
| 2002/0154556 | A1 | 10/2002 | Endoh et al. |
| 2005/0133875 | A1 | 6/2005 | Zhang |
| 2005/0280061 | A1 | 12/2005 | Lee |
| 2006/0171209 | A1 | 8/2006 | Sim et al. |
| 2006/0221708 | A1* | 10/2006 | Higashitani .............. 365/185.29 |
| 2007/0029607 | A1 | 2/2007 | Kouznetzov |
| 2007/0051700 | A1 | 3/2007 | Lee et al. |
| 2007/0096202 | A1 | 5/2007 | Kang et al. |
| 2007/0252201 | A1 | 11/2007 | Kito et al. |
| 2008/0242034 | A1* | 10/2008 | Mokhlesi et al. ............. 438/287 |
| 2008/0296659 | A1 | 12/2008 | Park et al. |

FOREIGN PATENT DOCUMENTS

| | | |
|---|---|---|
| WO | WO2007148856 A1 | 12/2007 |
| WO | WO 2008/118432 | 10/2008 |
| WO | PCT/US2008/084683 | 7/2010 |

OTHER PUBLICATIONS

PCT/US2008/084683, May 25, 2009, PCT Int'l Search Report.

"NAND Flash Memory Growth Accelerates" Nikkei Electronics Asia—Sep. 2007 http://techon.nikkeibp.co.jp/article/HONSHI/20070831/138584/ 4 pages.

C.M. Gronet, et al. "Thin, highly doped layers of epitaxial silicon deposited by limited reaction processing" download Jun. 29, 2007 http://apl.aip.org/api/copyright.jsp.

Chang-Hyun Lee, et al. "Charge Trapping Memory Cell of TANOS (si-Oxide-SiN-Al2O3-TaN) Structure Compatible to Conventional NAND Flash Memory" IEEE 2006 2 pages.

Chang-Hyun Lee, et al. "Multi-Level NAND Flash Memory with 63 nm-mode TANOS (Si-Oxide-SiN-Al2O3-TaN) Cell Structure" Symposium on VLSI Technology Digest of Technical Papers Aug. 2006 2 pages.

Esther Lam "Toshiba develops new 3D NAND flash technology" Jun. 12, 2007 DigiTimes http://www.digitimes.com/news/a20070612PR200.html 2 pages.

Ibrahim Ban, et al. "A Low-Thermal-Budget In Situ Dpoed Multilayer Silicon Epitaxy Process for MOSFET Channel Engineering" Journal of The Electrochemical Society 146(3) 1189-1196 (1999)

Kinam Kim "Technology for sub-50nm DRAM and NAND Flash Manufacturing" IEEE Aug. 2005.

* cited by examiner

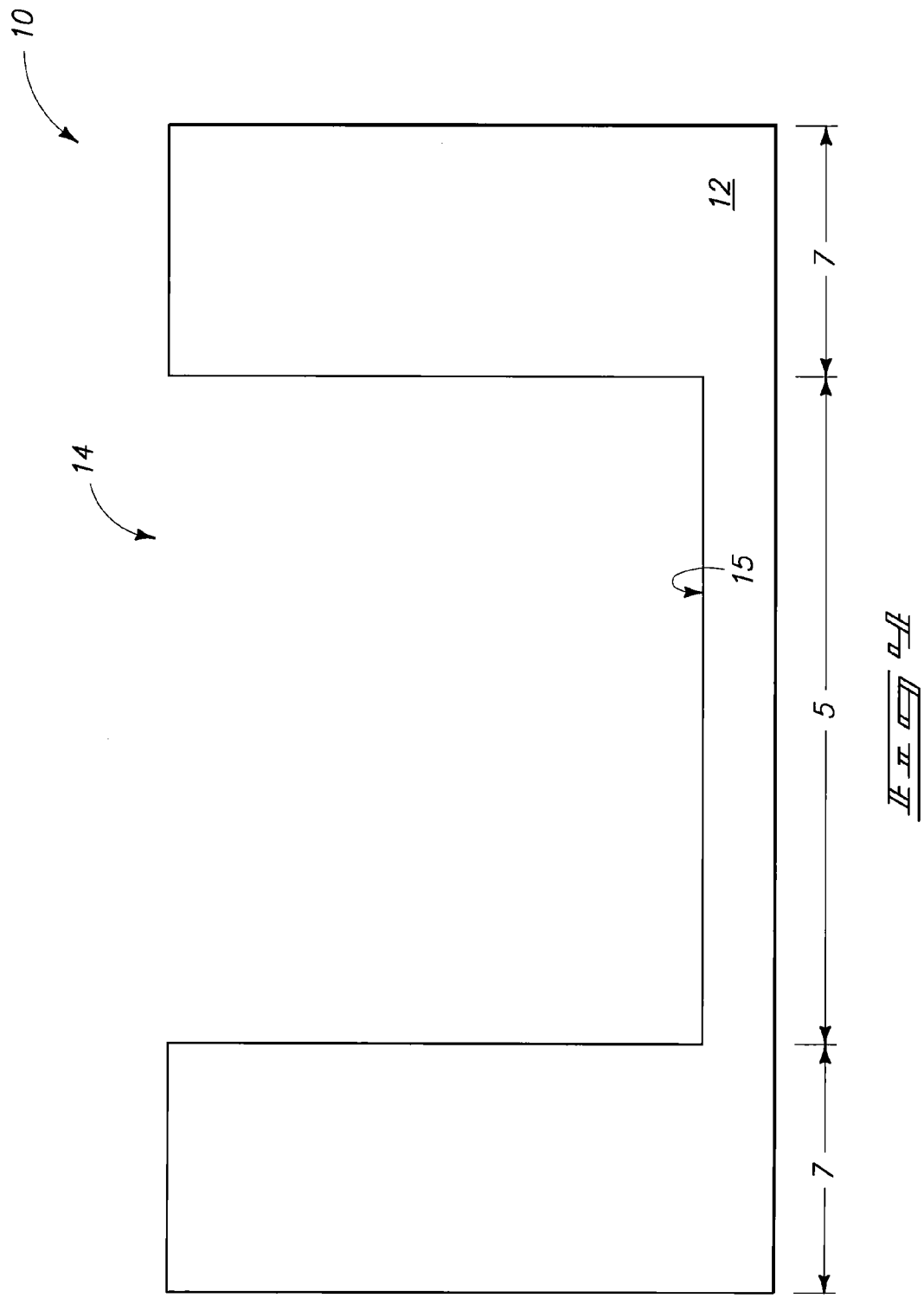

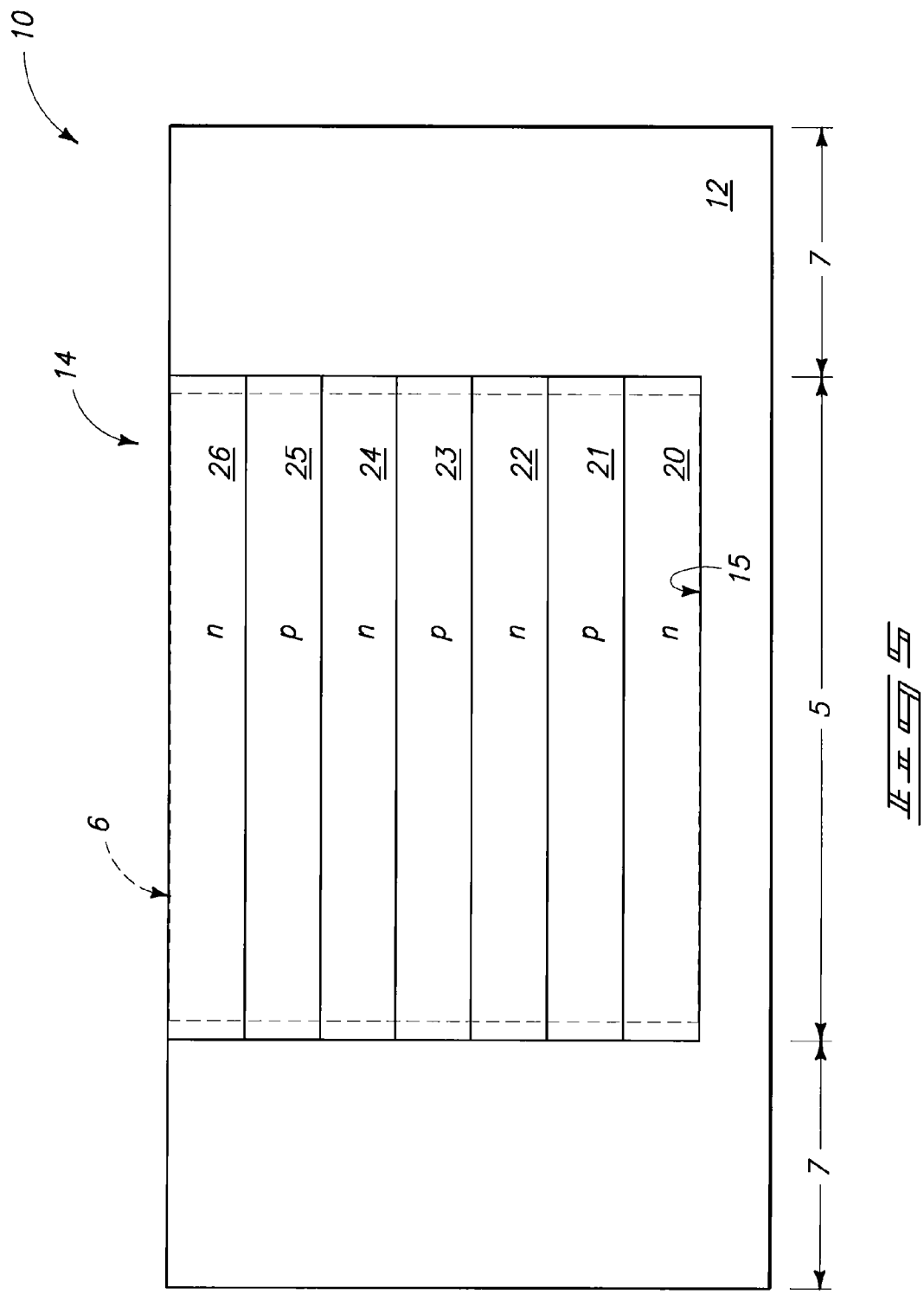

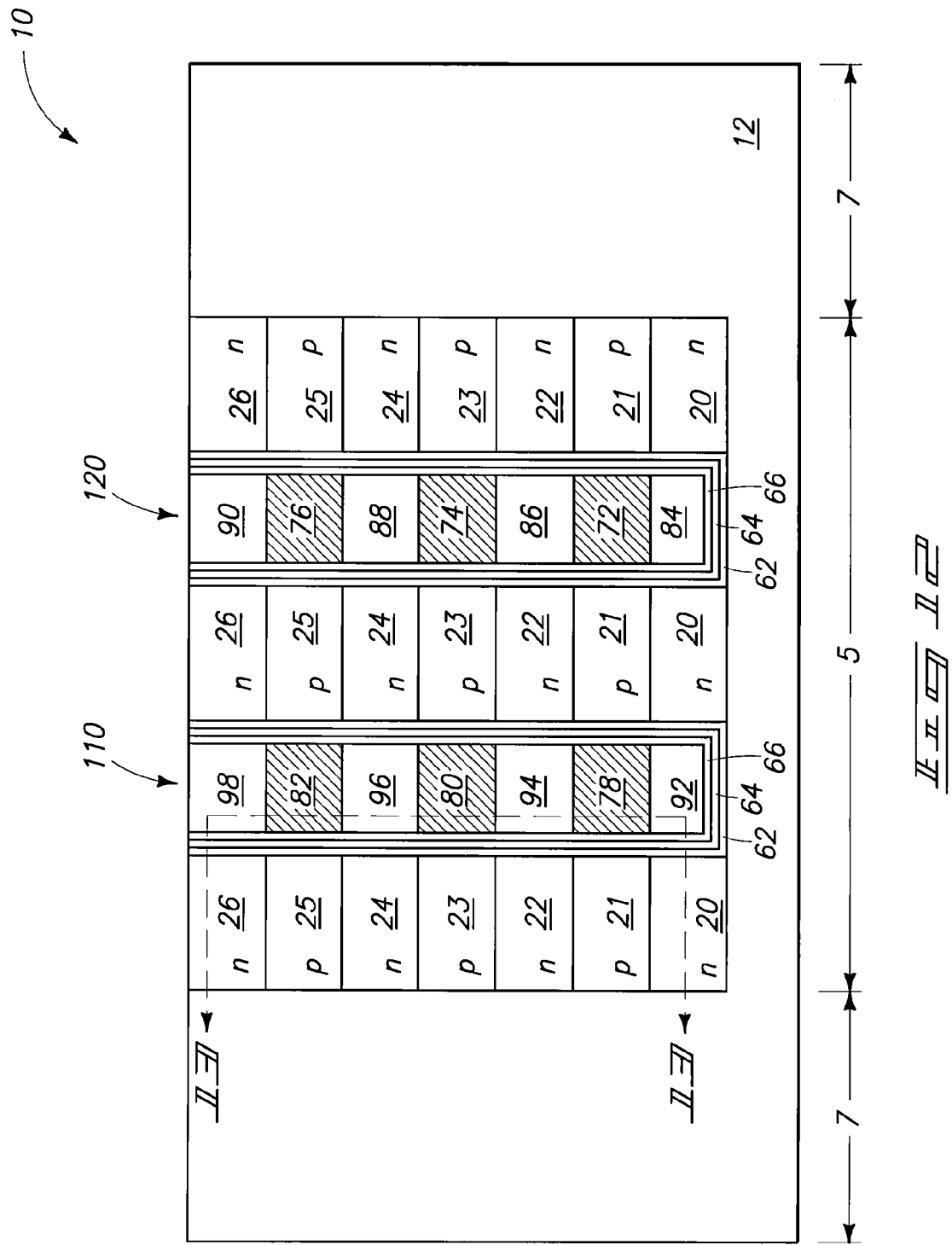

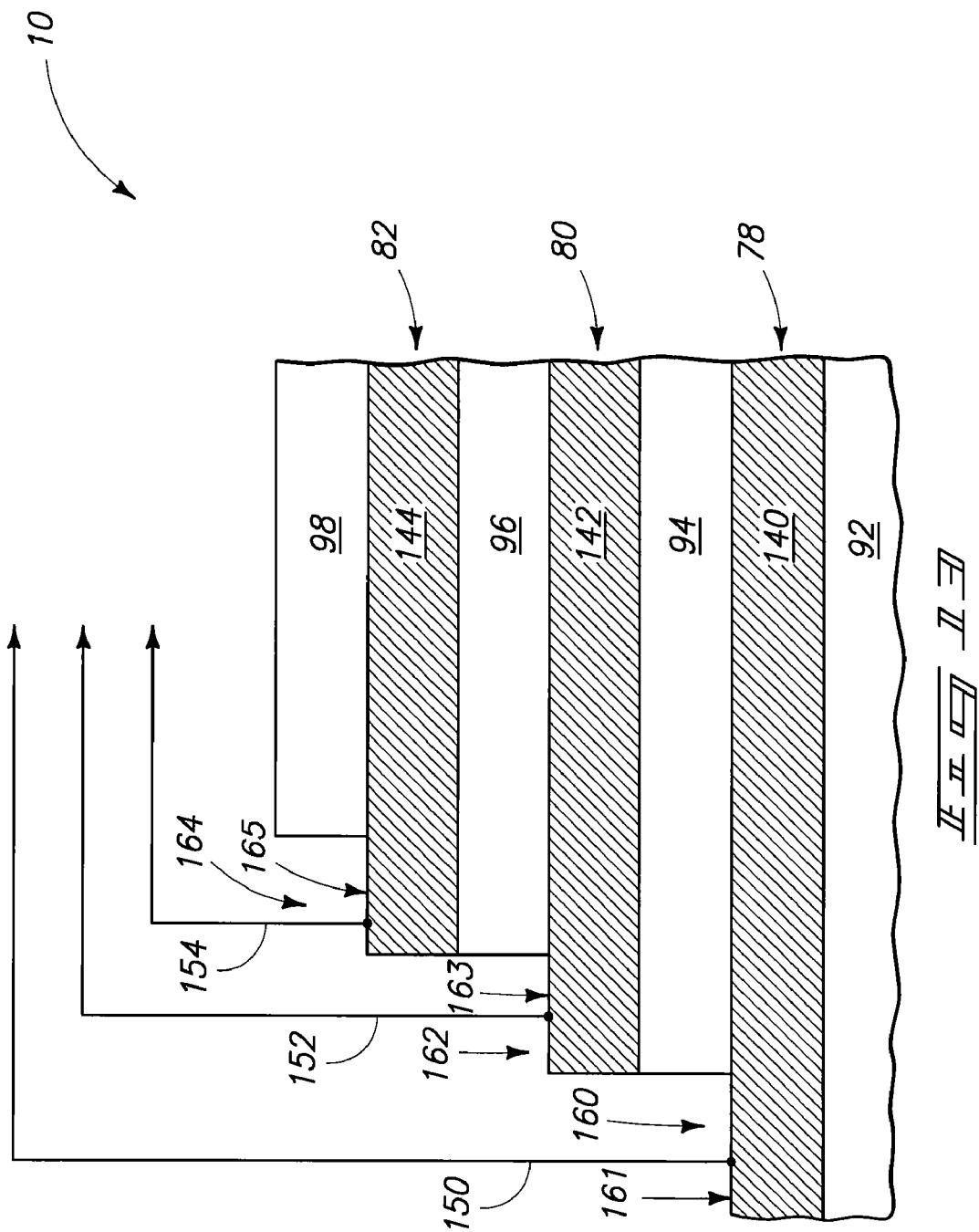

METHODS OF FORMING SEMICONDUCTOR CONSTRUCTIONS, AND METHODS OF FORMING NAND UNIT CELLS

TECHNICAL FIELD

Semiconductor constructions, NAND unit cells, methods of forming semiconductor constructions, and methods of forming NAND unit cells.

BACKGROUND

Memory devices provide data storage for electronic systems. One type of memory is a non-volatile memory known as flash memory. A flash memory is a type of EEPROM (electrically-erasable programmable read-only memory) that may be erased and reprogrammed in blocks. Many modern personal computers have BIOS stored on a flash memory chip. Such a BIOS is sometimes called a flash BIOS. Flash memory is also popular in wireless electronic devices because it enables the manufacturer to support new communication protocols as they become standardized, and to provide the ability to remotely upgrade the devices for enhanced features.

A typical flash memory comprises a memory array that includes a large number of memory cells arranged in row and column fashion. The cells are usually grouped into blocks. Each of the cells within a block may be electrically programmed by charging a charge-storage material. The charge may be removed from the charge-storage material by a block erase operation. Data is stored in a cell as charge in the charge-storage material.

NAND is a basic architecture of flash memory. A NAND cell unit comprises at least one selecting device coupled in series to a serial combination of memory cells (with the serial combination being commonly referred to as a NAND string).

A continuing goal of semiconductor fabrication is to increase integration. Accordingly, it is desired to develop new NAND architecture which consumes less semiconductor real estate than conventional NAND architecture, and to develop methods of forming such new NAND architecture.

BRIEF DESCRIPTION OF THE DRAWINGS

FIGS. 3-5 are diagrammatic, cross-sectional views of a semiconductor substrate at various stages of an example embodiment process for forming a memory array.

FIGS. 6-11 are diagrammatic, three-dimensional views of the semiconductor substrate of FIGS. 3-5 at various stages after FIG. 5 during the example embodiment process for forming a memory array. An edge of the three-dimensional view of FIG. 6 illustrates a view of the zone labeled "6" in FIG. 5.

FIG. 12 is a view along the cross-section of FIGS. 3-5 of the semiconductor substrate of FIGS. 3-11 at a stage after FIG. 11 of the example embodiment process for forming a memory array.

FIG. 13 is a diagrammatic, cross-sectional view along the line 13-13 of FIG. 12.

FIGS. 14 and 15 are diagrammatic, three-dimensional views of a semiconductor substrate analogous to the substrate of FIGS. 6-11 at various stages during another example embodiment process for forming a memory array.

DETAILED DESCRIPTION OF THE ILLUSTRATED EMBODIMENTS

Figure 1:
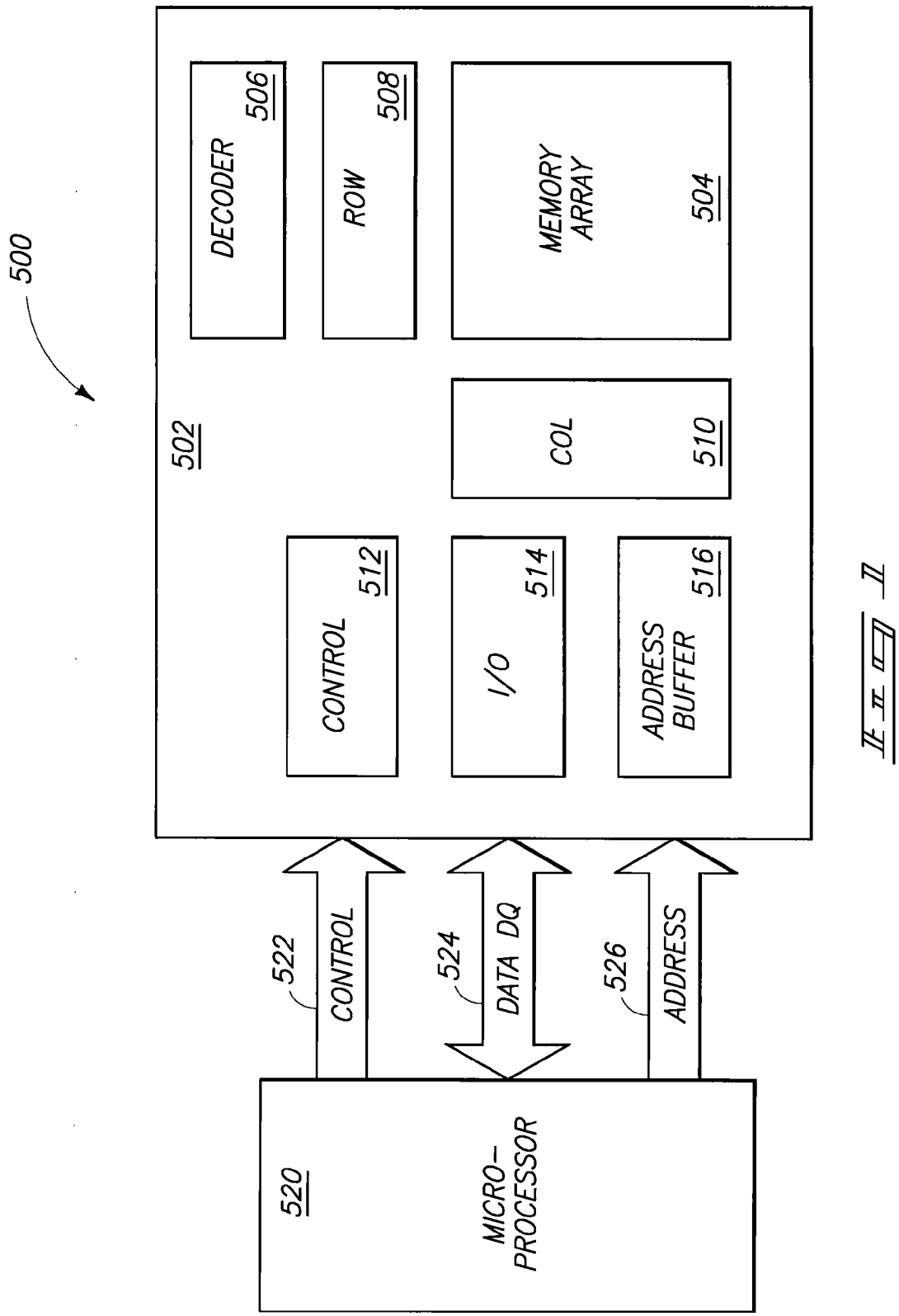
FIG. 1 is a simplified block diagram of a memory system in accordance with an embodiment.

FIG. 1 is a simplified block diagram of a memory system 500, according to an embodiment. Memory system 500 includes an integrated circuit flash memory device 502 (e.g., a NAND memory device), that includes an array of memory cells 504, an address decoder 506, row access circuitry 508, column access circuitry 510, control circuitry 512, input/output (I/O) circuitry 514, and an address buffer 516. Memory system 500 includes an external microprocessor 520, or memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

Figure 2:
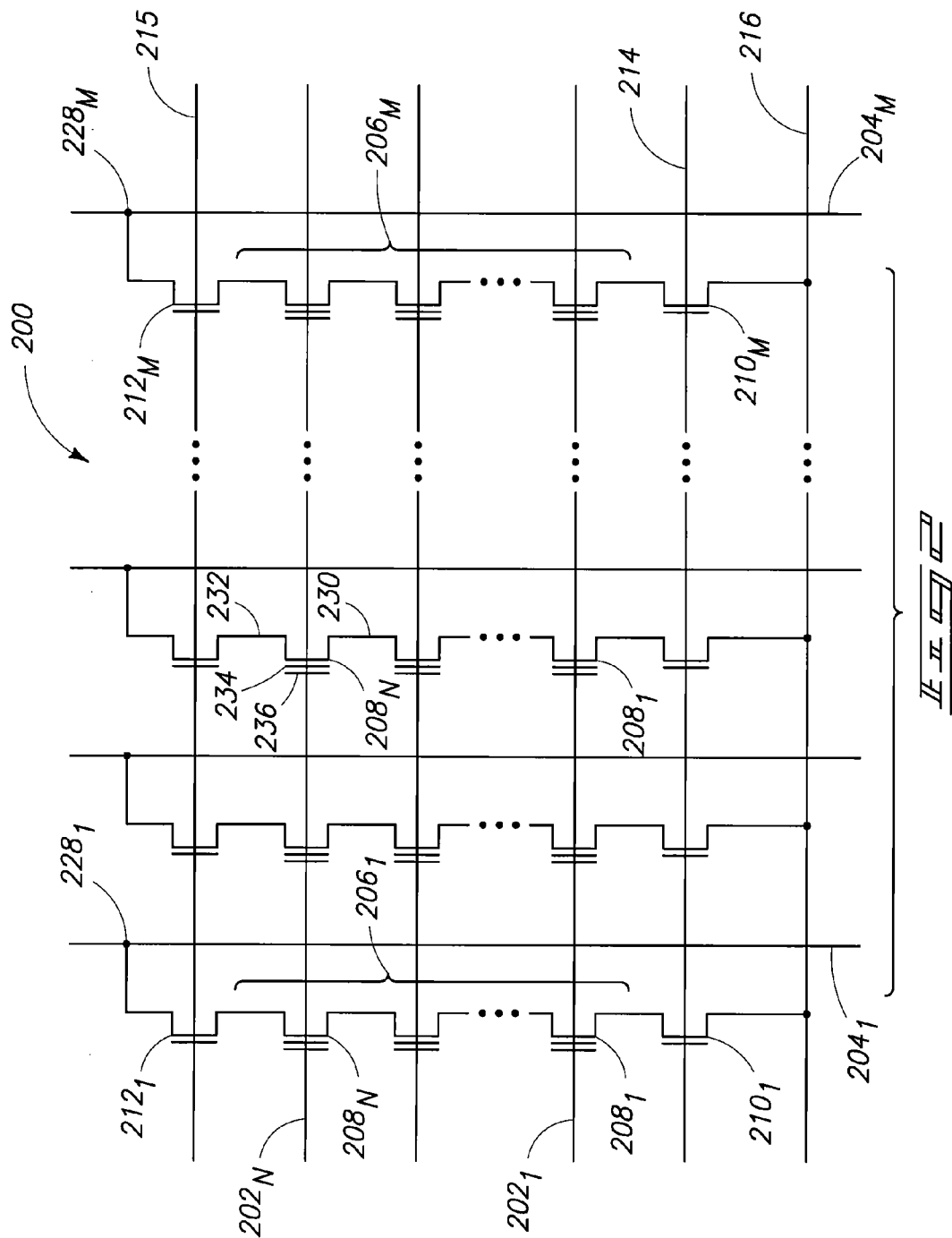
FIG. 2 is a schematic of a NAND memory array in accordance with an embodiment.

FIG. 2 is a schematic of a NAND memory array 200. Such may be a portion of memory array 504 of FIG. 1. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_M$. Each NAND string includes charge-trapping (or flash) transistors $208_1$ to $208_N$, which may be referred to herein as NAND string devices.

The charge-trapping transistors (i.e., NAND string devices) are located at intersections of wordlines 202 and local bitlines 204. The charge-trapping transistors 208 represent non-volatile memory cells for storage of data. The charge-trapping transistors 208 of each NAND string 206 are connected in series source to drain between a source selecting device 210 and a drain selecting device 212. Each source selecting device 210 is located at an intersection of a local bitline 204 and a source select line 214, while each drain selecting device 212 is located at an intersection of a local bitline 204 and a drain select line 215.

A source of each source selecting device 210 is connected to a common source line 216. The drain of each source selecting device 210 is connected to the source of the first charge-trapping transistor 208 of the corresponding NAND string 206. For example, the drain of source selecting device $210_1$ is connected to the source of charge-trapping transistor $208_1$ of the corresponding NAND string $206_1$. The source selecting devices 210 are connected to source select line 214.

The drain of each drain selecting device 212 is connected to a local bitline 204 for the corresponding NAND string at a drain contact 228. For example, the drain of drain selecting device $212_1$ is connected to the local bitline $204_1$ for the corresponding NAND string $206_1$ at drain contact $228_1$. The source of each drain selecting device 212 is connected to the drain of the last charge-trapping transistor 208 of the corresponding NAND string 206. For example, the source of drain selecting device 212$_1$ is connected to the drain of charge-trapping transistor 208$_N$ of the corresponding NAND string 206$_1$.

Charge-trapping transistors (i.e., NAND string devices) 208 include a source 230 and a drain 232, a charge-trapping material 234 (which may also be referred to as a charge-storage material), and a control gate 236. Charge-trapping transistors 208 have their control gates 236 coupled to a wordline 202. A column of the charge-trapping transistors 208 are those NAND strings 206 coupled to a given local bitline 204. A row of the charge-trapping transistors 208 are those transistors commonly coupled to a given wordline 202.

Individual NAND unit cells of the embodiment of FIG. 2 comprise a pair of selecting devices (for instance, selecting devices 210$_1$ and 212$_1$) and the string devices serially connected between the selecting devices (for instance, string devices 206$_1$). The NAND unit cells are conventionally formed to extend horizontally across a semiconductor substrate. Accordingly, each NAND unit cell may comprise a substantial amount of semiconductor real estate. Some embodiments recognize that semiconductor real estate may be conserved by forming the NAND unit cells to extend vertically relative to a supporting semiconductor substrate, rather than horizontally. Some embodiments include methods of forming NAND unit cells that extend vertically relative to a supporting semiconductor substrate; and some embodiments include structures comprising NAND unit cells which extend vertically relative to a supporting semiconductor substrate.

Figure 15:
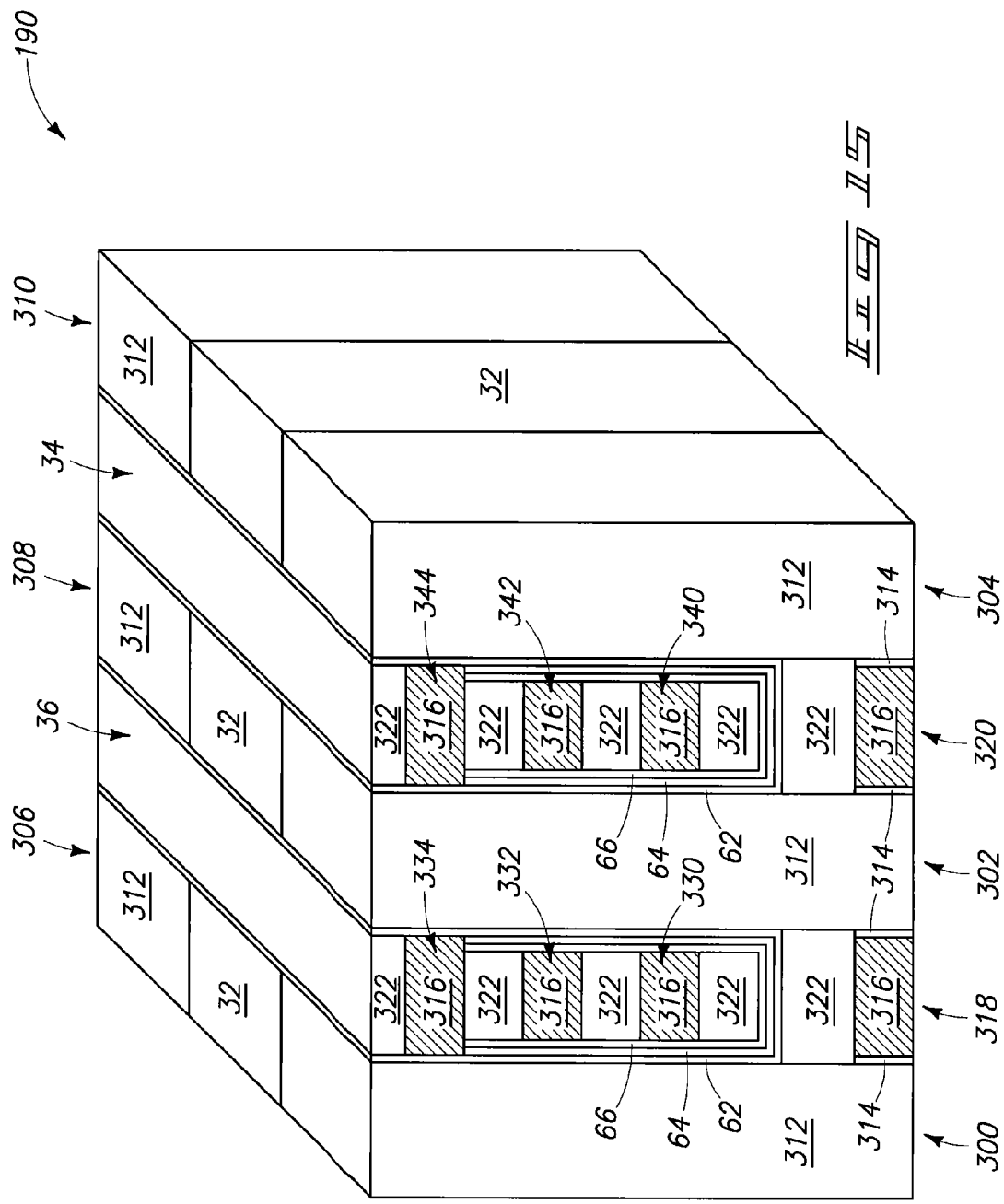

One example embodiment process for forming vertical NAND unit cells is described with reference to FIGS. 3-13, and another is described with reference to FIGS. 14 and 15. A difference between the embodiment of FIGS. 3-13 and that of FIGS. 14 and 15 is that a charge-trapping layer (the layer of charge-storage material 64 of FIGS. 11 and 15) extends along selecting devices in the embodiment of FIGS. 3-13 (for instance, the control gate structures 78 and 82 of FIG. 11 are comprised by selecting devices), and does not extend along the selecting devices in the embodiment of FIGS. 14 and 15 (for instance, the control gate structures 318 and 334 of FIG. 15 are comprised by selecting devices).

Figure 3:
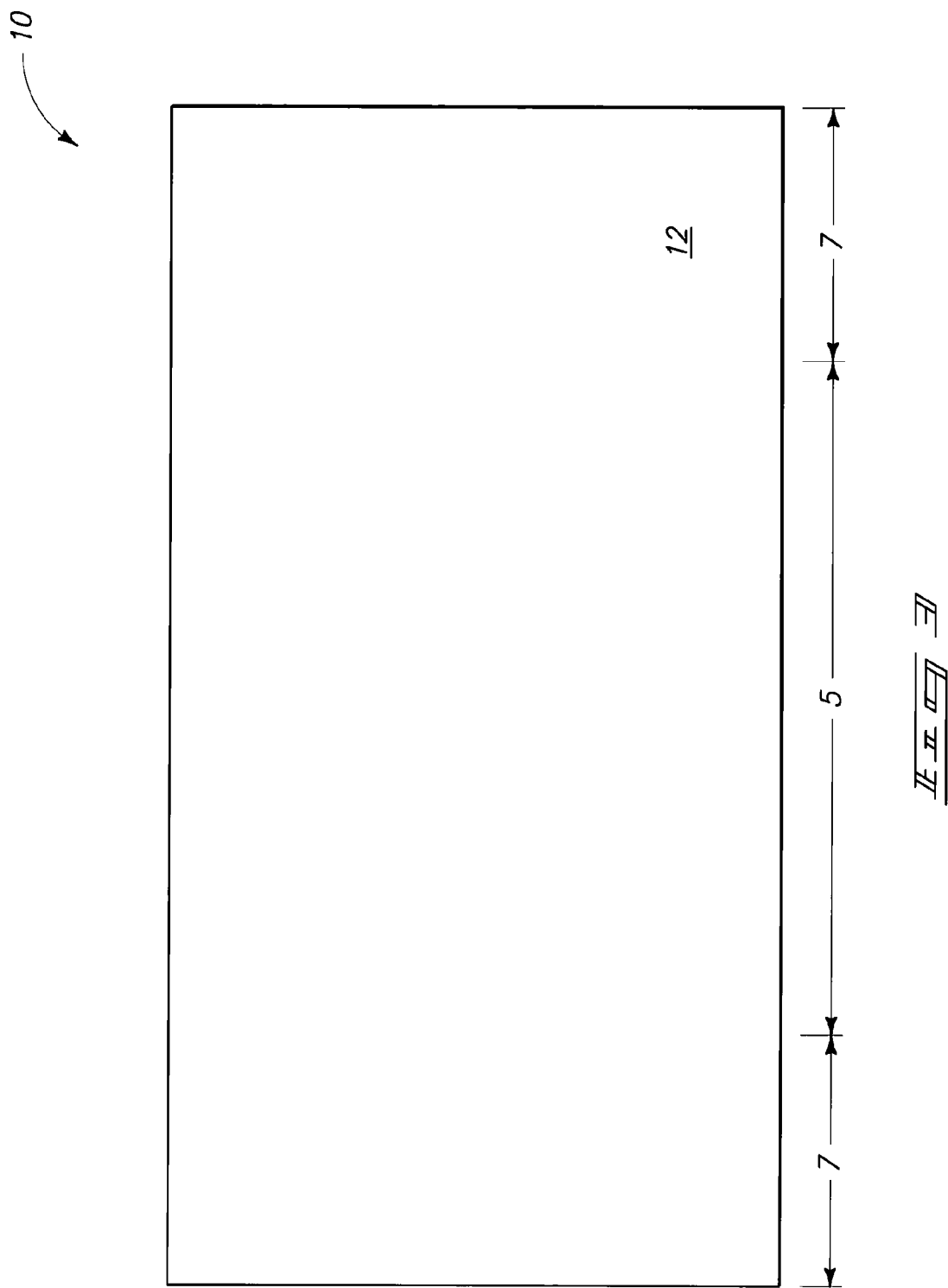

Referring to FIG. 3, a semiconductor construction 10 is shown to comprise a semiconductor base 12. Base 12 may comprise any suitable semiconductor composition or combination of semiconductor compositions, and may, for example, comprise, consist essentially of, or consist of monocrystalline silicon. Base 12 may be referred to as a semiconductor substrate in some embodiments. To aid in interpretation of the claims that follow, the terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc.

The base is shown divided amongst a memory array region 5, and a peripheral region 7 surrounding the memory array region. Ultimately, memory array circuitry is formed within region 5; and logic and/or other circuitry may be formed within region 7.

Referring to FIG. 4, a cavity 14 is formed to extend into base 12 within memory array region 5. The cavity may be formed by providing a patterned mask (not shown) over base 12, transferring a pattern from the mask into base 12, and physically removing the mask to leave the shown construction of FIG. 4. Cavity 14 has a lowermost surface 15 which may correspond to monocrystalline silicon of base 12 in some embodiments.

Figure 5:
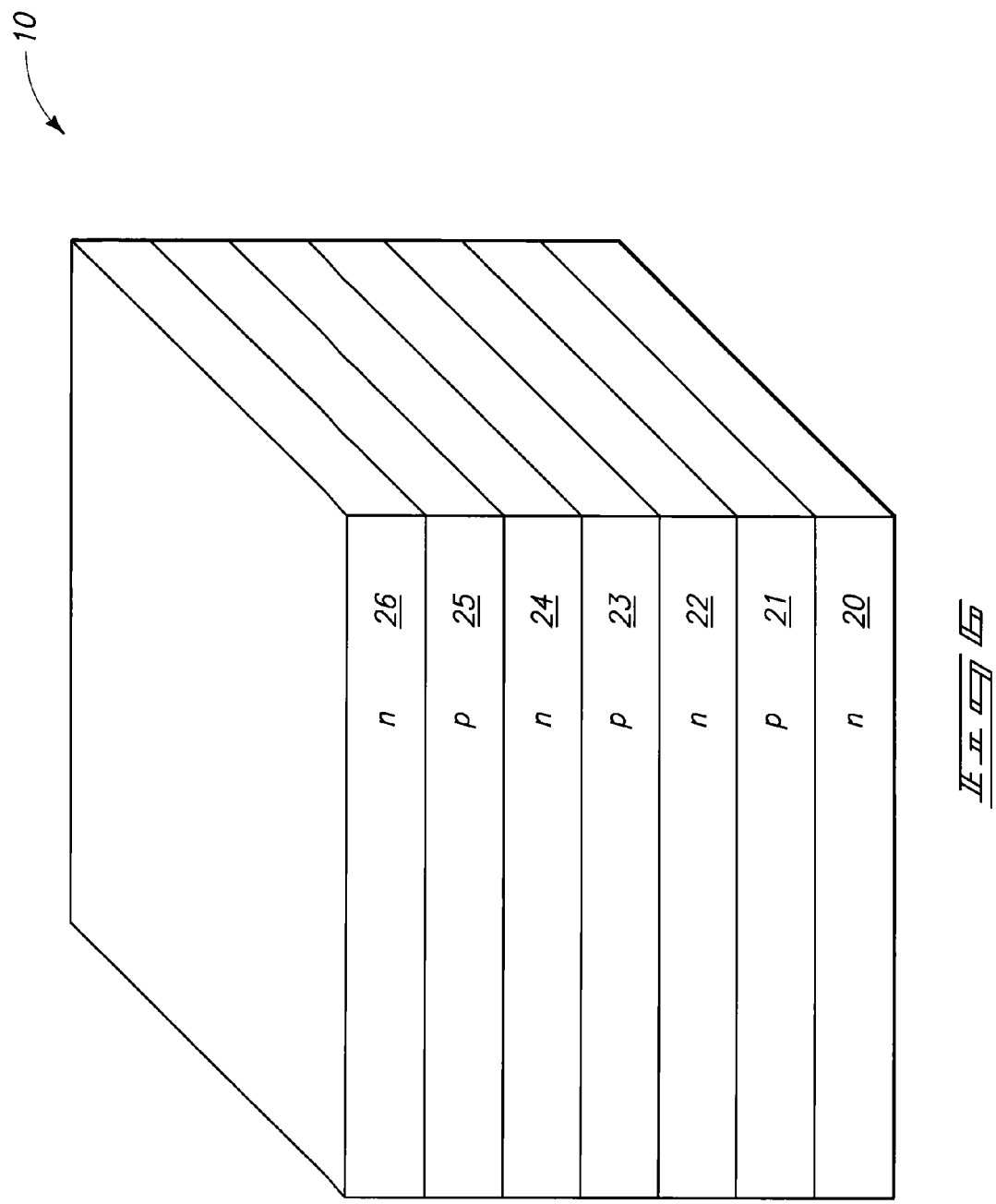

Referring to FIG. 5, layers 20, 21, 22, 23, 24, 25 and 26 of semiconductor material are formed within cavity 14. Such layers may comprise monocrystalline silicon epitaxially grown from monocrystalline silicon exposed along the lower surface 15 of cavity 14. The layers 20-26 are shown to be alternating layers of n-type doped semiconductor material and p-type doped semiconductor material (specifically, layers 20, 22, 24 and 26 are n-type doped semiconductor material; and layers 21, 23 and 25 are p-type doped semiconductor material). The layers 20-26 may be in situ doped during epitaxial growth of the layers, and/or at least one of the layers may be doped after growth of the layer by implanting dopant into the layer.

FIG. 6 shows a three-dimensional view of a portion of construction 10 comprising the layers 20-26; and specifically shows a three-dimensional view of a portion labeled as "6" in FIG. 5.

Figure 7:
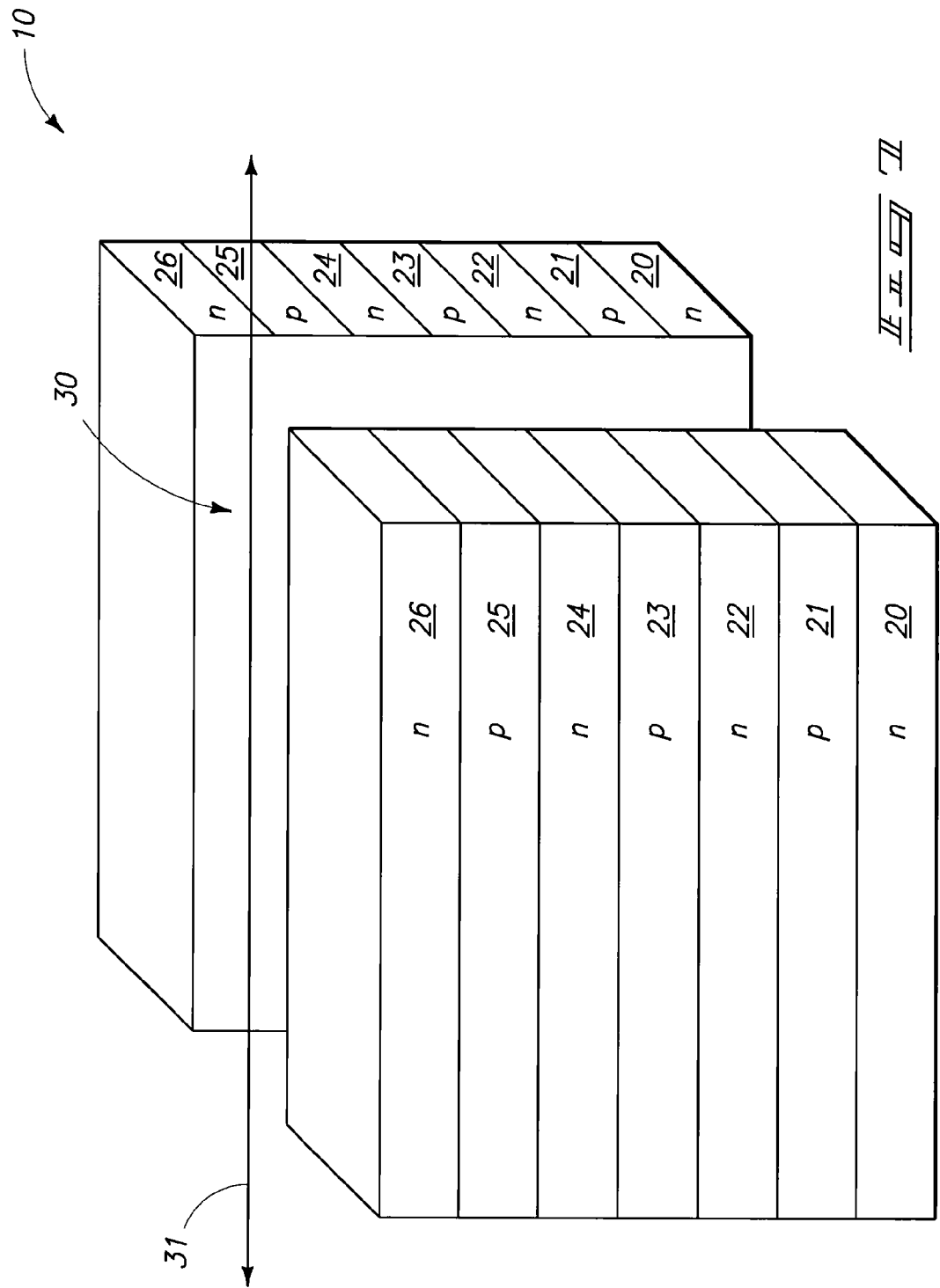

Referring to FIG. 7, a trench 30 is formed through the epitaxially-grown layers 20-26. Trench 30 extends along a horizontal direction parallel to a horizontal axis 31. The trench may be formed by providing a patterned mask (not shown), such as a mask of photolithographically-patterned photoresist, over layer 26; transferring a pattern from the mask to underlying layers 20-26; and subsequently removing the mask to leave the shown construction.

Trench 30 may be representative of a number of parallel trenches simultaneously formed through layers 20-26. Such trenches may be displaced from one another in directions extending orthogonal to axis 31, and may each extend along a horizontal direction parallel to horizontal axis 31.

Figure 8:
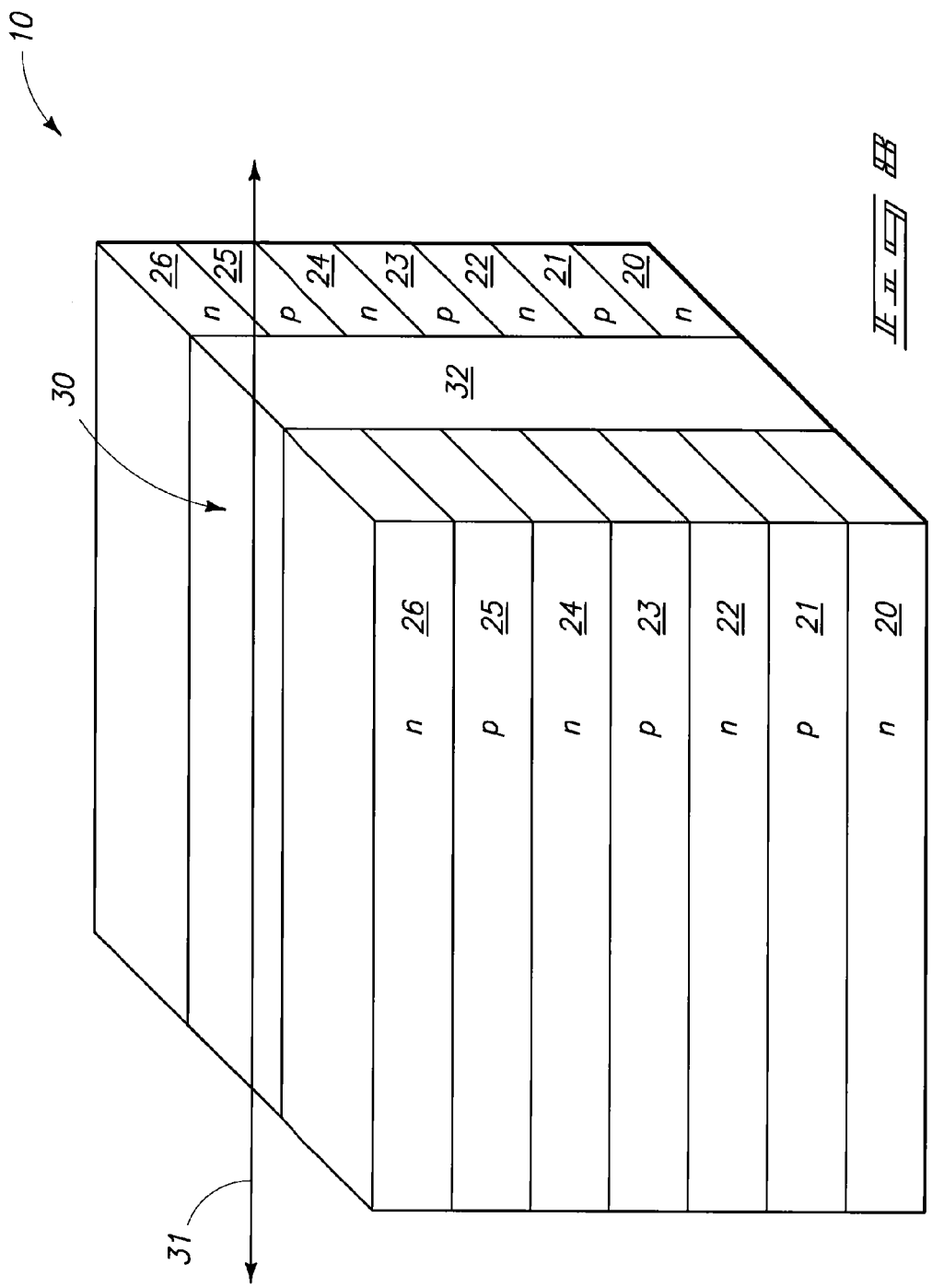

Referring to FIG. 8, trench 30 is filled with electrically insulative isolation material 32. Isolation material 32 may comprise any suitable composition or combination of compositions; and may, for example, comprise, consist essentially of, or consist of one or more of silicon dioxide and any of various low-k dielectric materials (with low-k dielectric materials being dielectric materials that have a dielectric constant less than that of silicon dioxide).

Material 32 is shown to have an upper surface that is coplanar with an upper surface of layer 26. Such construction may be formed by initially forming material 32 to overfill trench 30, and then utilizing chemical-mechanical polishing (CMP) to remove excess material 32 from outside of the trench and form the planarized surface extending across material 32 and layer 26.

Figure 9:
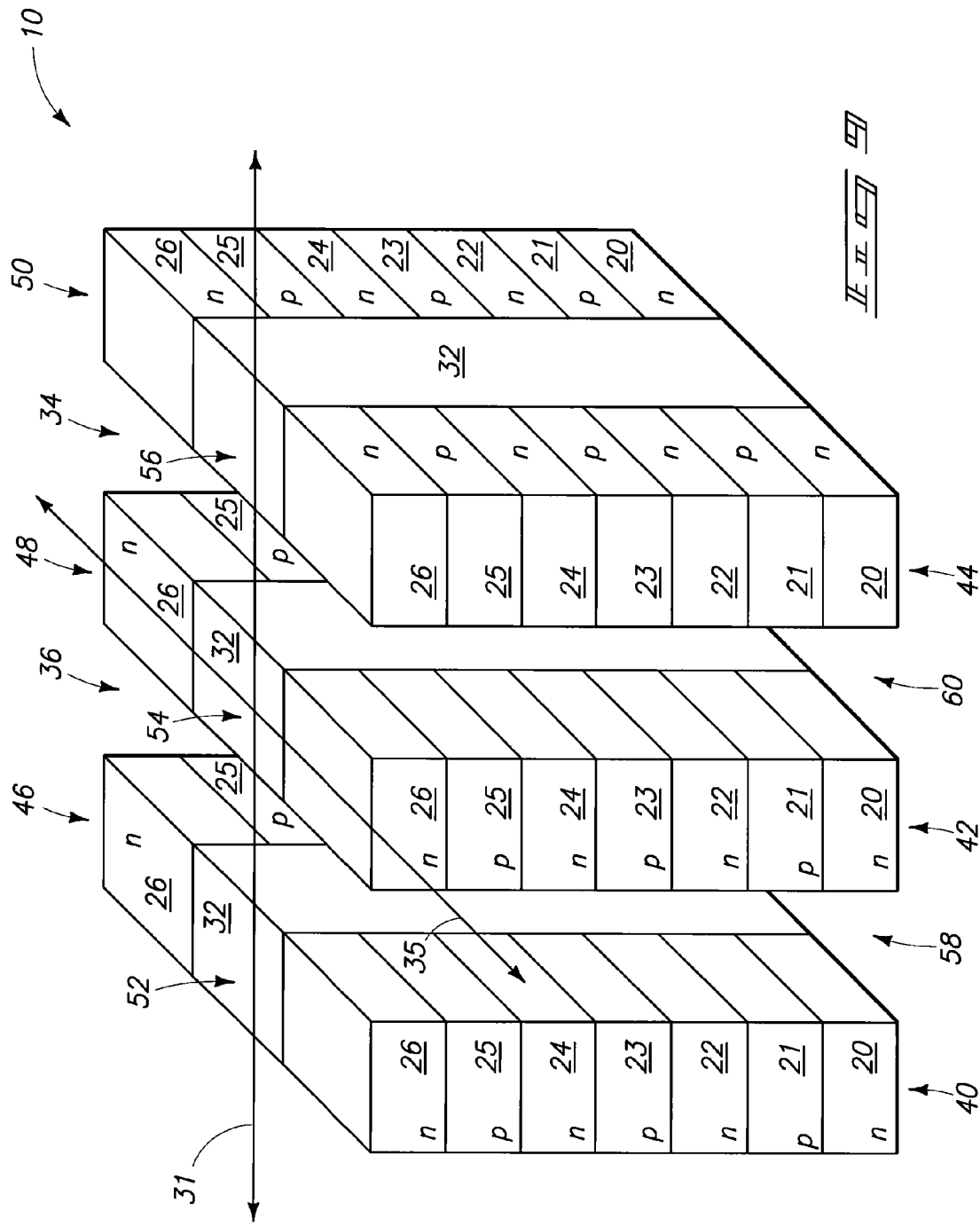

Referring to FIG. 9, a pair of trenches 34 and 36 are formed to extend through alternating n-type doped and p-type doped layers 20-26, and through isolation material 32. Trenches 34 and 36 may be referred to as second trenches, and the trench 30 (FIG. 7) may be referred to as a first trench to distinguish the trenches 34 and 36 formed at the processing stage of FIG. 9 from the trench 30 formed at the processing stage of FIG. 7.

The trenches 34 and 36 extend along horizontal directions that are orthogonal to the horizontal direction of trench 30. In other words, trenches 34 and 36 extend parallel to an axis 35 that is orthogonal to the axis 31 along which trench 30 is parallel.

Trenches 34 and 36 may be representative of a large plurality of trenches that are formed to extend parallel to axis 35.

Trenches 30 (FIG. 7), 34 and 36 together pattern layers 20-26 into a plurality of vertical structures 40, 42, 44, 46, 48 and 50. Such vertical structures may be referred to as vertical pillars or columns. Adjacent vertical structures are either spaced from one another by electrically insulative dividers corresponding to material 32, or by openings (which may also be referred to as gaps). For instance, adjacent vertical structures 40 and 46 are spaced from one another by an insulative divider 52 corresponding to material 32; adjacent vertical structures 42 and 48 are spaced from one another by an insulative divider 54 corresponding to material 32; and adjacent vertical structures 44 and 50 are spaced from one another by an insulative divider 56 corresponding to material 32. Also, adjacent vertical structures 40 and 42 are spaced from one another by an opening 58 (which is the part of trench 36 between structures 40 and 42); and adjacent vertical structures are 42 and 44 are spaced one another by an opening 60 (which is the part of trench 34 between structures 42 and 44).

Figure 10:
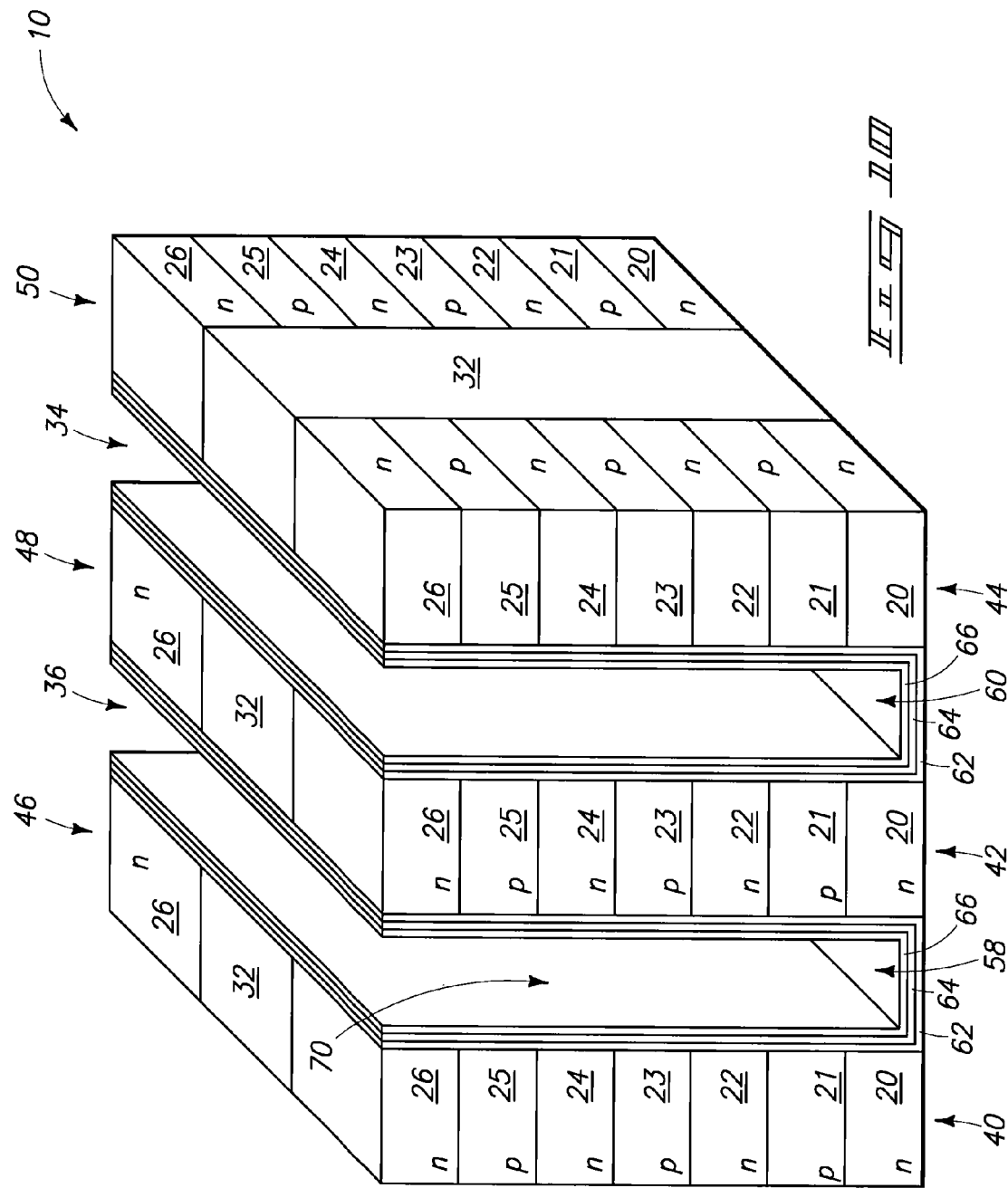
Figure 11:
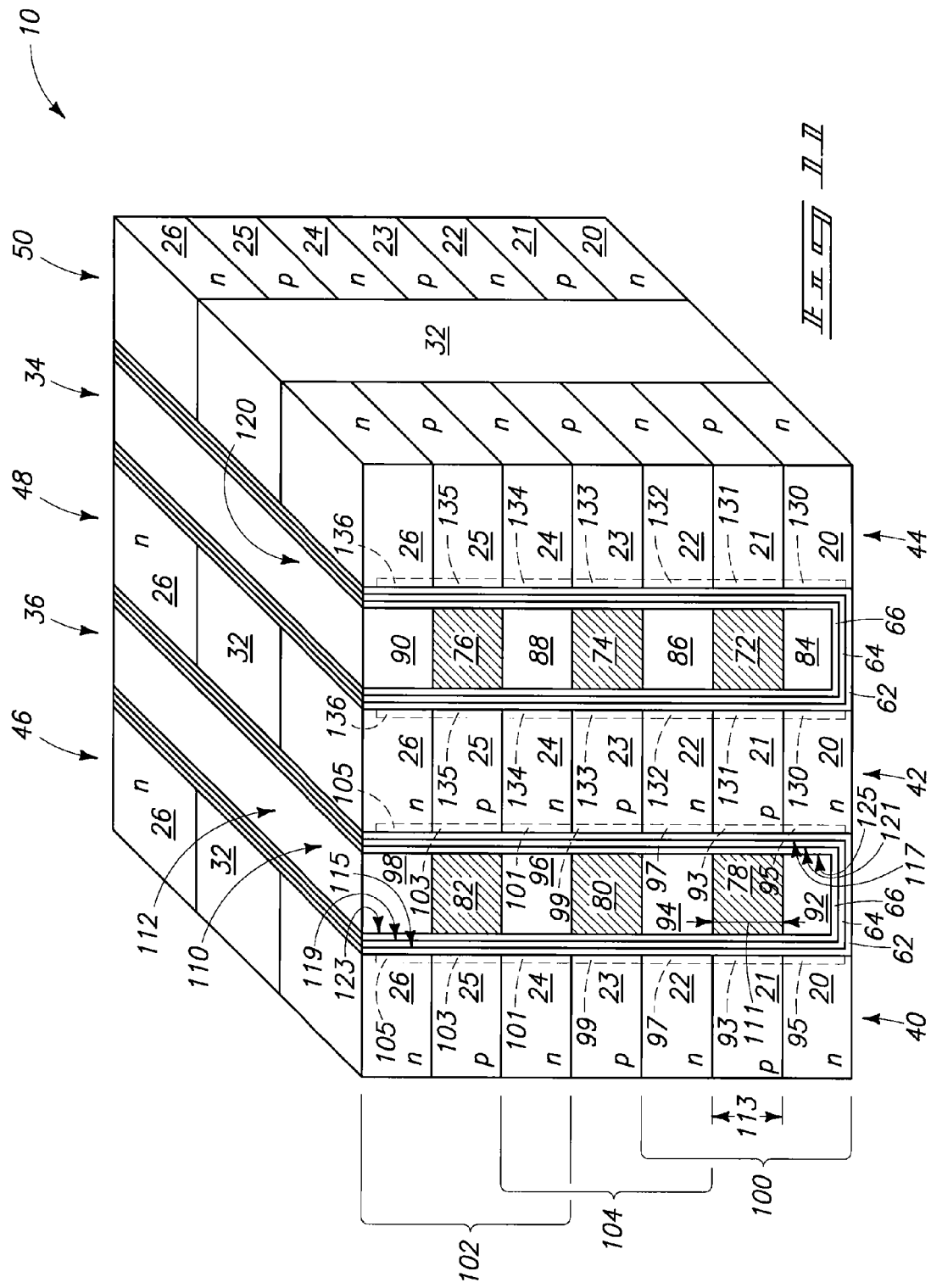
Figure 11A:
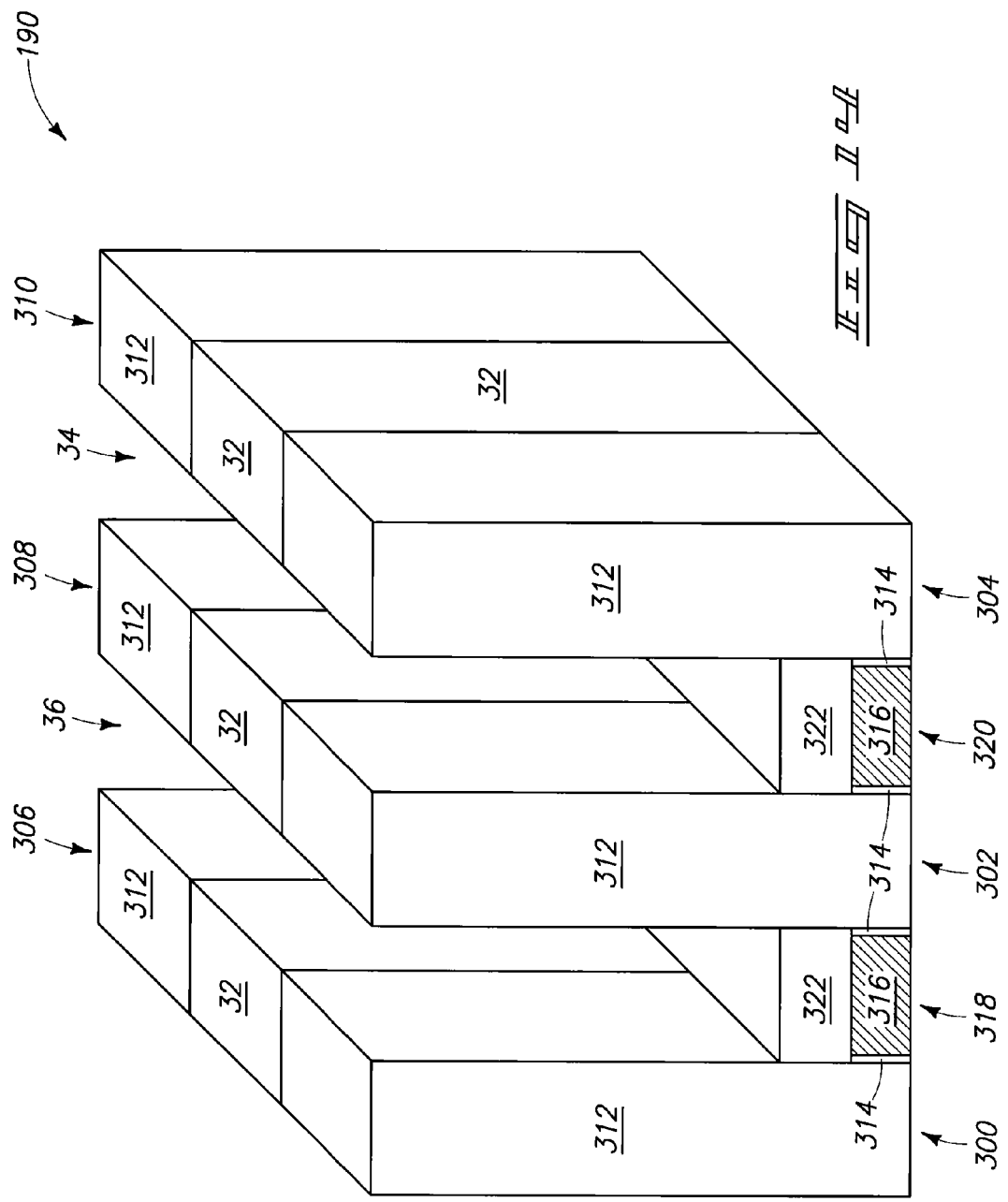

Referring to FIG. 10, materials 62, 64 and 66 are formed within trenches 34 and 36. Materials 62, 64 and 66 may correspond to tunnel dielectric, charge-storage material, and charge-blocking material, respectively.

The tunnel dielectric may comprise any suitable composition or combination of compositions, and may, for example, comprise one or more of silicon dioxide, high-k dielectric compositions (with high-k dielectric compositions being dielectric compositions having a dielectric constant greater than that of silicon oxide, such as, for example, hafnium oxide, zirconium oxide, aluminum oxide, etc.), and low-k dielectric compositions. In some embodiments, the tunnel dielectric may consist of a single composition (for instance, silicon dioxide, SiON, high-k dielectric material or low-k dielectric material). In other embodiments, the tunnel dielectric may comprise multi-composition stacks. Example stacks are an ONO stack (i.e., a stack of silicon nitride/silicon dioxide/silicon nitride); and other multi-layer stacks comprising high-k materials and/or silicon dioxide and/or low-k materials.

The charge-storage material may comprise one or more charge-trapping compositions. Example charge-trapping compositions are metallic and semiconductive nanodots, and charge-trapping insulative materials (such as silicon nitride). If the charge-storage material comprises nanodots, the nanodots may be embedded in insulative material which may or not be itself charge-trapping. Example insulative materials that can be used for embedding the nanodots are materials comprising one or more of silicon dioxide, any of various high-k dielectric materials (for instance, aluminum oxide, hafnium oxide, zirconium oxide, etc.), and any of various low-k dielectric materials.

The charge-blocking material may comprise one or more electrically insulative compositions, and may, for example, comprise silicon dioxide and/or various high-k dielectric compositions (for instance, aluminum oxide, hafnium oxide, zirconium oxide, etc.).

The materials 62, 64 and 66 may be considered to line vertical structures 40, 42, 44, 46, 48 and 50; and in the shown embodiment may be considered to partially fill openings 58 and 60 to narrow such openings. The materials 62, 64 and 66 may be formed sequentially utilizing any suitable processing, including, for example, one or more of atomic layer deposition (ALD), chemical vapor deposition (CVD), and physical vapor deposition (PVD).

In the shown embodiment, tunnel dielectric material 62 forms a layer within trench 36 that corresponds to an upwardly-opening container 70. The charge-storage material 64 and the charge-blocking material 66 form layers within such upwardly-opening container that partially fill the container and narrow the container.

The layers of materials 62, 64 and 66 are shown to comprise uppermost surfaces that are co-planar with the uppermost surfaces of semiconductor material 26 and isolation material 32. Such may be accomplished by initially forming the layers of materials 62, 64 and 66 to extend over upper surfaces of semiconductor material 26 and isolation material 32, and than utilizing planarization (for instance, CMP) to remove materials 62, 64 and 66 from over the upper surfaces of semiconductor material 26 and isolation material 32.

Referring to FIG. 11, control gate structures 72, 74 and 76 are formed within trench 34, and control gate structures 78, 80 and 82 are formed within trench 36. Also, electrically insulative structures (which may also be referred to as spacers) 84, 86, 88 and 90 are formed within trench 34; and electrically insulative structures 92, 94, 96 and 98 are formed within trench 36. The insulative structures 84, 86, 88 and 90 alternate with the control gate structures 72, 84 and 86 within trench 34; and similarly the insulative structures 92, 94, 96 and 98 alternate with the control gate structures 78, 80 and 82 within trench 36. Laser ablation and/or other directional deposition techniques may utilized to form the alternating insulative structures and control gate structures; and/or metals may be selectively deposited by one or both of ALD and CVD.

The control gate structures may comprise any suitable electrically conductive composition or combination of electrically conductive compositions, and may, for example, comprise one or more of various metals (for instance, tantalum, tungsten, etc.), metal-containing compositions (for instance, metal nitride, metal silicide, etc.) and conductively-doped semiconductor material (for instance, conductively-doped silicon, etc.). The electrically insulative structures may comprise any suitable electrically insulative composition or combination of compositions, and may, for example, comprise, consist essentially of, or consist of silicon dioxide.

The control gate structures, together with tunnel dielectric material 62, charge-storage material 64, charge-blocking material 66, and doped regions of vertical structures 40, 42, 44, 46, 48 and 50 form a plurality of devices of NAND unit cells. For instance, in the shown embodiment there are three control gate structures (78, 80 and 82) formed within trench 36. The control gate structures 78, 80 and 82 may be distinguished from one another based on their elevational location within trench 36, and accordingly the control gate structures 78, 80 and 82 may be referred to as a bottom control gate structure, intermediate control gate structure and top control gate structure, respectively. The bottom control gate structure 78 may be incorporated into a selecting device 100 of a NAND unit cell 110, the top control gate structure 82 may be incorporated into another selecting device 102 of the NAND unit cell, and the intermediate control gate structure 80 may be incorporated into a string device 104 of the NAND unit cell; with the NAND unit cell 110 thus extending vertically within trench 36 between vertical columns 40 and 42.

Referring to selecting device 100, such comprises channel regions 93 within p-type doped layer 21, source/drain regions 95 and 97 within n-type doped layers 20 and 22, and regions of tunnel dielectric 62, charge-storage material 64 and charge-blocking material 66 between control gate structure 78 and the channel regions 93. In the shown embodiment, control gate structure 78 is between a pair of channel regions 93, with the channel regions being on laterally opposing sides of the control gate structure 78.

Referring to string device 104, such comprises channel regions 99 within p-type doped layer 23, shares the source/drain regions 97 with selecting device 100, comprises source/drain regions 101 within n-type doped layer 24, and comprises regions of tunnel dielectric 62, charge-storage material 64 and charge-blocking material 66 between control gate structure 80 and the channel regions 99.

Referring to selecting device 102, such comprises channel regions 103 within p-type doped layer 25, shares the source/drain regions 101 with string device 104, comprises source/drain regions 105 within n-type doped layer 26, and comprises regions of tunnel dielectric 62, charge-storage material 64 and charge-blocking material 66 between control gate structure 82 and the channel regions 103.

One of the selecting devices 100 and 102 corresponds to a drain selecting device and the other corresponds to a source selecting device. The drain of the drain selecting device will be connected to a local bitline (analogous to one of the bitlines 204 of FIG. 2), and the source of the source selecting device will be connected to a common source line (analogous to the common source line 216 of FIG. 2). The bitlines and common source lines are not shown in FIG. 11. In some embodiments, either the bitlines or common source lines may correspond to electrically conductive lines running below layer 20 and in electrically connection with source/drain regions in layer 20; and the other of the bitlines and common source lines may correspond to electrically conductive lines running above layer 26 and in electrically connection with source/drain regions in layer 26. For instance, common source lines may be formed as n-type doped channels running beneath the bottom layer 20. Such channels may be formed at the processing stage of FIG. 4 prior to the epitaxial growth of layer 20.

Although one string device (i.e., charge-trapping device) 104 is shown in the example NAND unit cell 110, there may be many more string devices formed in NAND unit cells of some embodiments. For instance, there may be 16 string devices, 32 string devices, 64 string devices, etc.; with the number of string devices in a NAND unit cell often desired to be a power of two.

In the shown embodiment, the control gate structures (for instance, control gate structures 78, 80 and 82 of NAND unit cell 110) are horizontally aligned with p-type doped regions (for instance, control gate structure 78 is horizontally aligned with p-type doped regions 21); and accordingly the individual flash memory cells have channel regions in p-type doped semiconductor material, and source/drain regions in n-type doped semiconductor material, analogous to NMOS devices. In other embodiments, the control gate structures may be horizontally aligned with the n-type doped regions so that the channel regions are in n-type doped semiconductor material, and the source/drain regions are in p-type doped semiconductor material; and accordingly the individual flash memory cells will be analogous to PMOS devices.

In the shown embodiment, the control gate structures are the same vertical thickness as the p-type doped regions that the control gate structures are horizontally aligned with. For instance, control gate structure 78 is horizontally aligned with p-type doped region 21; and control gate structure 78 has a vertical thickness 111 that is the same as the vertical thickness 113 of p-type doped region 21.

The column comprising control gate structures 78, 80 and 82 alternating with insulative material structures 92, 94, 96 and 98 of FIG. 11 (i.e., the column of alternating conductive and insulative structures that is formed in trench 36) may be referred to as a first vertical column 112. The pillars 40 and 42 of alternating n-type doped semiconductor material and p-type doped semiconductor material may be referred to as second and third vertical columns, respectively. The second and third vertical columns 40 and 42 are shown to be on opposing sides of the first vertical column 112 from one another. The tunnel dielectric 62, charge-storage material 64 and charge-blocking material 66 define vertically-extending layers that are between the first vertical column 112 and the second and third vertical columns 40 and 42. The n-type doped regions of the second vertical column 40 are horizontally aligned with the n-type doped regions of the third vertical column 42, and the p-type doped regions of the second vertical column 40 are horizontally aligned with the p-type doped regions of the third vertical column 42. The control gate structures 78, 80 and 82 are shown to be horizontally aligned with the p-type doped regions.

The second and third vertical columns may comprise any suitable semiconductor material, and may, for example, consist of doped monocrystalline silicon.

The individual flash memory cells of the NAND unit cell 110 comprise control gate material of the vertical column 112 (for instance, control gate material of control gate structure 80) together with tunnel dielectric material 62, charge-storage material 64 and charge-blocking material 66. In some embodiments, the flash memory cells may correspond to TANOS cells, and accordingly the tunnel dielectric material 62 may comprise, consist essentially of, or consist of silicon dioxide; the charge-storage material 64 may comprise, consist essentially of, or consist of silicon nitride; the charge-blocking material 66 may comprise, consist essentially of, or consist of aluminum oxide; and the control gate structure 80 may comprise, consist essentially of, or consist of tantalum nitride.

Another way to consider the structure of FIG. 11 is that such comprises a plurality of pillars 40, 42, 44 that extend upwardly from a semiconductor base (with such base being the base 12 of FIG. 5), with each of the pillars comprising alternating n-type doped semiconductor material and p-type doped semiconductor material. The pillars 40 and 42 may be considered to be a first pillar and a second pillar, respectively, and may be considered to be adjacent to one another.

The tunnel dielectric 62 may be considered to be formed between the adjacent pillars 40 and 42. Further, the tunnel dielectric may be considered to comprise a first region 115 along and directly against the semiconductor material of the first pillar 40, and to comprise a second region 117 along and directly against the semiconductor material of the second pillar 42.

The charge-storage material 64 is along the tunnel dielectric 62, and may be considered to comprise a first region 119 along and directly against the first region of the tunnel dielectric, and to comprise a second region 121 along and directly against the second region of the tunnel dielectric.

The charge-blocking material 66 is along the charge-storage material, and may be considered to comprise a first region 123 along and directly against the first region of the charge-storage material, and to comprise a second region 125 along and directly against the second region of the charge-storage material.

The control gate structures 78, 80 and 82 may be considered to be laterally between adjacent pillars 40 and 42, and laterally between the first and second regions 123 and 125 of charge-blocking material 66. The control gate structures are horizontally spaced from one another, and the insulative material structures 94 and 96 may be considered to be within the spaces between the horizontally-spaced control gate structures.

The control gate structures 78, 80 and 82 may be considered to be comprised by electrically conductive lines that extend along a horizontal direction within the trench 36, and the construction 10 may be considered to comprise other pillars 44, 46, 48 and 50 in addition to the pillars 40 and 42. The electrically insulative material 32 may be considered to form electrically insulative dividers that separate some of the pillars from one another. For instance, the insulative material 32 forms an electrically insulative divider between pillars 40 and 46, and forms an electrically insulative divider between pillars 42 and 48. The electrically insulative dividers may be considered to be vertical columns that extend along an entire vertical periphery of the pillars. The electrically conductive lines comprising the control gate structures are within trenches (for instance trench 36) that are between adjacent electrically insulative dividers.

The horizontally-spaced control gate structures 78, 80 and 82 may be considered to be a first set of control gate structures, and the horizontally-spaced control gate structures 72, 74 and 76 may be considered to be a second set of control gate structures that is on an opposing side of pillar 42 from the first set of control gate structures. In operation, the second set of control gate structures 72, 74 and 76 is incorporated into a NAND unit cell 120 that is analogous to the NAND unit cell 110. The control gate structures 72, 74 and 76 form a second set of flash devices that have channel regions 131, 133 and 135 in p-type doped layers 21, 23 and 25, respectively; and that have source/drain regions 130, 132, 134 and 136 in n-type doped layers 20, 22, 24 and 26, respectively.

In the shown embodiment, pillar 42 comprises channel regions and source/drain regions from NAND unit cell 110 along one lateral side, and comprises channel regions and source/drain regions from NAND unit cell 120 along an opposing lateral side. The channel regions and source/drain regions are along surfaces of the p-type doped layers and n-type doped layers, and accordingly the channel regions and source/drain regions from NAND unit cell 110 will not interfere (i.e. cross-couple) with those of NAND unit cell 120 if pillar 42 is sufficiently wide (which may be, for example, a width of at least about 1000 Å). If cross-coupling is problematic, insulative material spacers may be formed down the center of the pillars (for instance, pillar 42) to alleviate, or eliminate, such cross-coupling.

FIG. 12 is a view along the cross-section of FIG. 5 showing the memory array region of FIG. 11 together with a remaining portion of base 12. The control gate structures 72, 74, 76, 78, 80 and 82 are part of conductive lines that extend into and out of the page relative to the cross-section of FIG. 12. FIG. 13 shows a cross-section orthogonal to that of FIG. 12 and illustrates one method for electrically connecting the lines comprising control gate structures 78, 80 and 82 to other circuitry. Specifically, FIG. 13 shows a fragment comprising insulative materials 92, 94, 96 and 98, and comprising conductive lines 140, 142 and 144 that comprise control gate structures 78, 80 and 82, respectively. The conductive lines 140, 142 and 144 extend beyond the NAND unit cell 110 (FIG. 12) containing control gate structures 78, 80 and 82, and may be analogous to the lines 214, 202 and 215 of FIG. 2, respectively.

A plurality of interconnects 150, 152 and 154 are in one-to-one correspondence with the layers 140, 142 and 144. The layers 140, 142 and 144 form a series of steps 160, 162 and 164 at one lateral end, with the steps progressively becoming more laterally inward in going from lower layer 140 to upper layer 142. The steps 160, 162 and 164 have exposed platforms 161, 163 and 165, respectively. The interconnects 150, 152 and 154 electrically contact the conductive layers 140, 142 and 144 at the exposed platforms in the shown embodiment to form a "shark jaw" type series of connections.

The NAND unit cells of FIGS. 11-13 may be part of a large memory array having hundreds, thousands, millions or more of identical NAND unit cells. The embodiments of FIGS. 11-13 advantageously form the individual NAND unit cells to extend vertically over a semiconductor base, which can conserve semiconductor real estate (and thus increase the density of memory cell integration) relative to conventional architecture in which NAND unit cells are formed horizontally relative to a semiconductor base. In some embodiments, channel length and other characteristics of flash memory cells utilized in NAND unit cells may be controlled, at least in part, by controlling the thickness of epitaxially-grown semiconductor layers, and by controlling the thickness of deposited conductive material layers that comprise control gate structures. Such thicknesses may be easier to control and scale than at least some of the parameters that have been utilized to control channel length of flash memory cells in conventional NAND unit cells.

The embodiment of FIG. 11 shows the charge-storage material 64 being between the selecting devices (for instance, the devices comprising the control gate structures 78 and 82) and the channel regions accessed by the selecting devices. In other embodiments, it may be desired that the charge-storage material extends only along the string devices, and not along the selecting devices. FIGS. 14 and 15 illustrate a method of forming an example construction in which the charge-storage material extends only along the string devices, and not along the selecting devices.

Referring to FIG. 14, a semiconductor construction 190 is illustrated at a processing stage after that of FIG. 9. The construction 190 is analogous to the construction 10 of FIGS. 3-9, and comprises pillars 300, 302, 304, 306, 308 and 310 analogous to the pillars 40, 42, 44, 46, 48 and 50 of FIG. 9. Pillars 300, 302, 304, 306, 308 and 310 comprise semiconductor material 312, which is analogous to the semiconductor 12 discussed above with reference to FIG. 1. The construction 190 also comprises insulative material 32 extending between some of the pillars, and comprises trenches 34 and 36 extending through material 312. The pillars 300, 302, 304, 306, 308 and 310 may comprise alternating n-type and p-type regions analogous to those shown the pillars 40, 42, 44, 46, 48 and 50 of FIG. 9. Such alternating n-type and p-type regions are not shown in FIG. 14 in order to simplify the drawings.

Tunnel dielectric 314 is shown formed along a sidewalls at the bottoms of trenches 34 and 36, and control gate material 316 is shown formed along the gate oxide. The tunnel dielectric 314 may comprise the same compositions as the tunnel dielectric 62 discussed above (FIG. 10), and the control gate material 316 may comprise the same compositions as the control gate structures 72, 74, 76, 78, 80, and 82 discussed above (FIG. 11). The control gate material 316 within trench 36 is incorporated into a selecting device 318 between pillars 300 and 302, and the control gate material 316 within trench 34 is incorporated into a selecting device 320 between pillars 302 and 304.

An insulative material 322 is formed over the control gate material 316. The insulative material 322 may comprise the same compositions as the insulative structures 84, 86, 88, 90, 92, 94, 96 and 98 discussed above (FIG. 11).

Referring to FIG. 15, the portions of trenches 34 and 36 remaining over insulative material 322 are lined with tunnel dielectric material 62, charge-storage material 64 and charge-blocking material 66. Subsequently, alternating control gate material 316 and insulative material 322 is formed within trenches 34 and 36 to fill the trenches. The control gate material forms control gate structures 330, 332, 334, 340, 342 and 346.

The control gate structures 330, 332, 340 and 342 are incorporated into string devices; and the control gate structures 334 and 344 are incorporated into selecting devices. Portions of charge-storage material 64 and charge-blocking material 66 are removed prior to forming control gate structures 334 and 336 so that the control gates of the selecting devices are spaced from the adjacent pillars (300, 302 and 304) only by tunnel dielectric 62.

The construction of FIG. 15 differs from that of FIG. 11 in that the control gates of the selecting devices (i.e., the devices comprising control gate structures 318, 320, 334 and 344) of the FIG. 15 construction are spaced from adjacent semiconductor pillars (300, 302 and 304) only by tunnel dielectric material (314 and 62), rather than by a combination of tunnel dielectric material with charge-storage material and charge-blocking material. In some embodiments, the string devices of the FIG. 15 construction (for instance, the devices comprising control gate structures 330 and 332) may be considered to be part of a column that is vertically between a pair of selecting devices (for instance, the selecting devices comprising control gate structures 318 and 334).

The flash memory cells and NAND unit cells of various embodiments may be utilized in various electronic systems, such as, for example, cars, clocks, cell phones, computers, etc.

Figure 16:
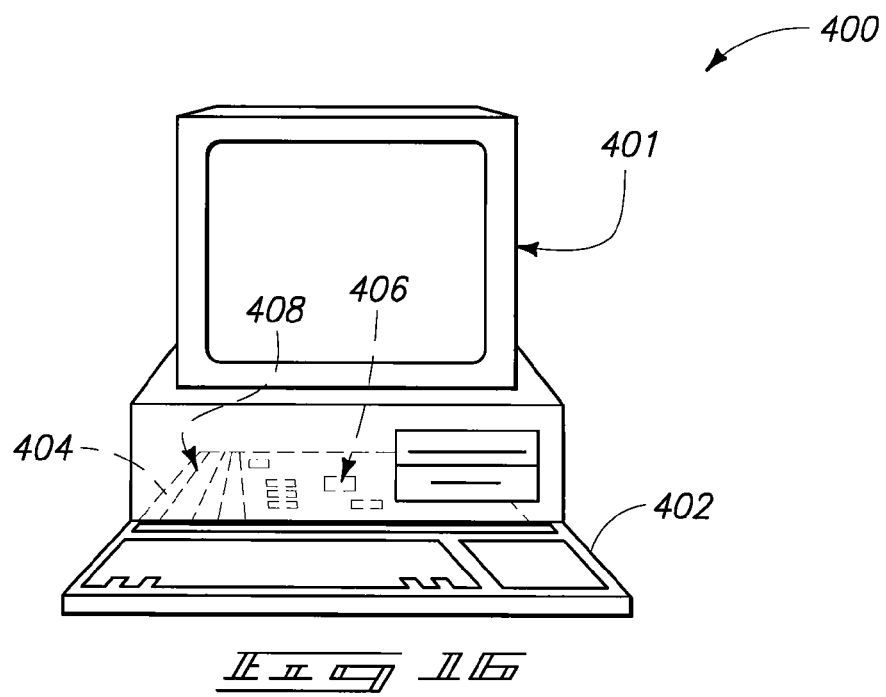
FIG. 16 is a diagrammatic view of a computer embodiment.
Figure 17:
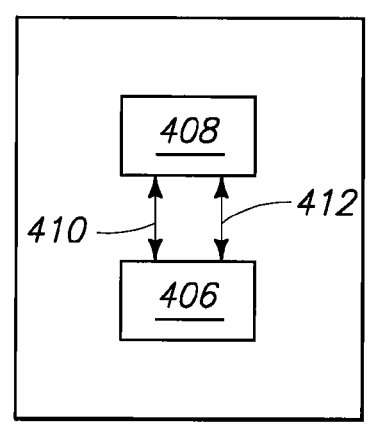
FIG. 17 is a block diagram showing particular features of the motherboard of the FIG. 14 computer embodiment.

FIG. 16 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 17. In such block diagram, the addressing circuitry is illustrated as 410 and the read circuitry is illustrated as 412.

Processor device 406 may correspond to a processor module, and associated memory utilized with the module may comprise NAND.

Memory device 408 may correspond to a memory module, and may comprise flash memory configured as NAND.

Figure 18:
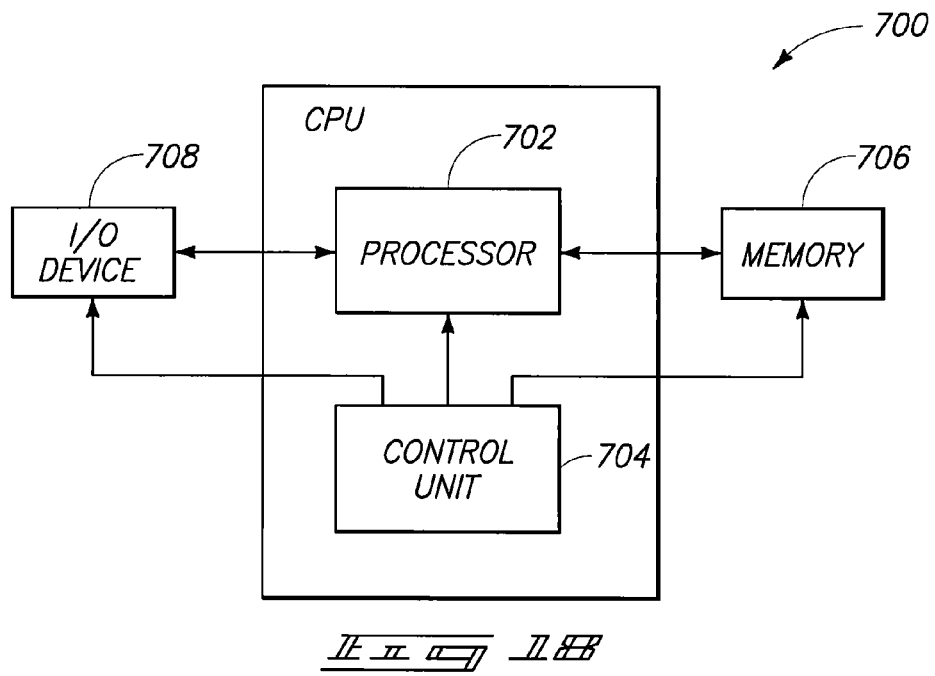
FIG. 18 is a high level block diagram of an electronic system embodiment.

FIG. 18 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include flash memory, such as a flash card, and at least some of such flash memory may be configured as NAND.

Figure 19:
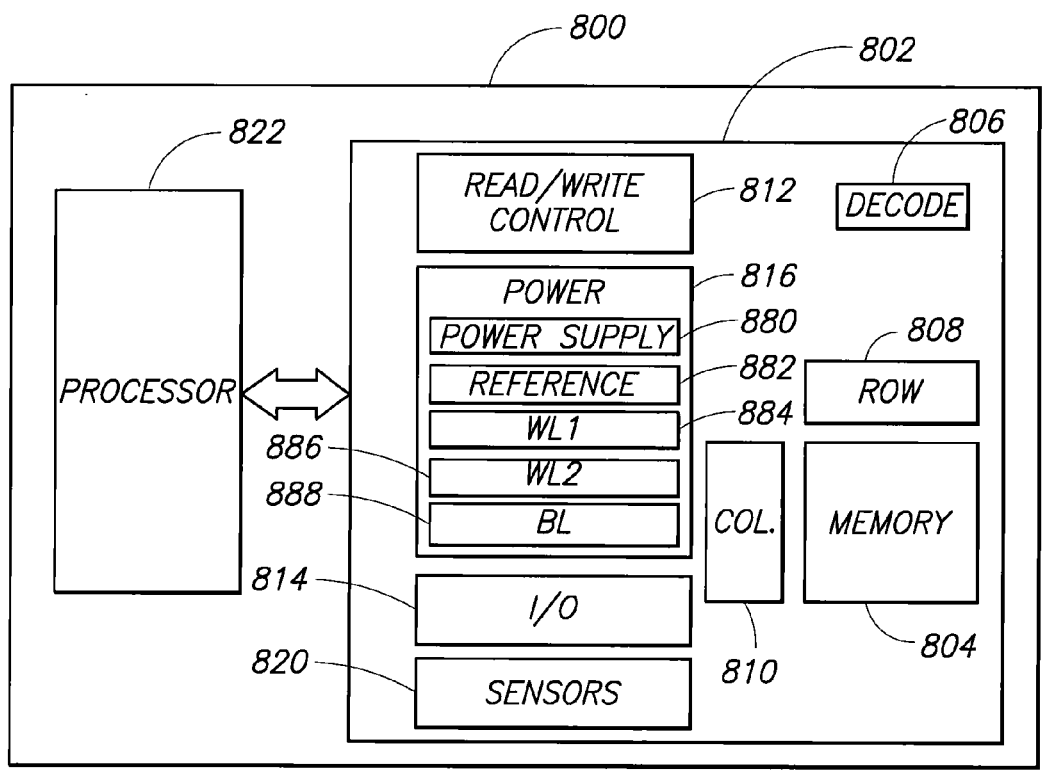
FIG. 19 is a simplified block diagram of a memory device embodiment.

FIG. 19 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include flash memory, and at least some of such flash memory may be configured as NAND.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. A method of forming a NAND unit cell, comprising:
forming vertical columns of a semiconductor material over a substrate, the columns comprising alternating n-type doped layers of the semiconductor material and p-type doped layers of the semiconductor material; each of the columns comprising at least four layers of the n-type doped semiconductor material and at least three layers of the p-type doped semiconductor material; each of the columns extending vertically away from the substrate with a first one of the doped layers being nearer to the substrate than the other doped layers and the other doped layers being above both the substrate and the first one of the doped layers;
after forming the columns that comprise at least four layers of the n-type doped semiconductor material in alternating relationship with at least three layers of the p-type doped semiconductor material, lining the columns with, in sequential order, a layer of tunnel dielectric, a layer of charge-storage material, and a layer of charge-blocking material, the layer of tunnel dielectric forming an upward-opening container; and forming alternating layers of electrically insulative material and electrically conductive material between the lined columns and within the opening within the container; the layers of electrically conductive material forming a plurality of horizontally-spaced control gate structures within the opening within the container; at least some of the control gate structures being incorporated into string devices of the NAND unit cell, wherein a first control gate structure of the plurality of control gate structures within the container is spaced from a second control gate structure of the plurality of control gate structures within the container that is immediately adjacent the first control gate structure only by the electrically insulative material and wherein the forming of the alternating layers of electrically insulative material and electrically conductive material comprises forming the first control gate structure above the layer of charge-blocking material and forming the second control gate structure above the first control gate structure.

2. The method of claim 1 wherein some of the control gate structures are incorporated into selecting devices of the NAND unit cell.

3. The method of claim 1 wherein all of the control gate structures are incorporated into string devices, and further comprising forming selecting devices which are above and below the string devices, the selecting devices comprising control gates that are spaced from the lined columns only by the tunnel dielectric.

4. The method of claim 1 wherein the substrate comprises monocrystalline silicon, and wherein the forming the vertical columns comprises:

epitaxially growing alternating layers of n-type doped semiconductor material and p-type doped semiconductor material over the substrate, with a first of the alternating layers being grown on the monocrystalline silicon of the substrate; and patterning the epitaxially-grown layers into the vertical columns.

5. The method of claim 4 wherein the patterning the vertical columns comprises:

forming at least one first trench in the epitaxially-grown layers, with the at least one first trench extending along a first horizontal direction;

filling the at least one first trench with electrical isolation material;

after filling the at least one first trench, forming second trenches that extend into the epitaxially-grown layers and the electrical isolation material, with the second trenches extending along a second horizontal direction that is orthogonal to the first horizontal direction;

wherein the lining the columns comprises forming the layers of tunnel dielectric, charge-storage material, and blocking dielectric within the second trenches; and wherein the alternating layers of electrically insulative material and electrically conductive material are formed within the second trenches.

6. The method of claim 1 wherein the n-type layers have substantially the same thickness as the p-type layers.

7. The method of claim 1 wherein at least one of the p-type layers is incorporated into a selecting device of the NAND unit cell and at least one of the p-type layers is incorporated into a string device of the NAND unit cell and wherein a sidewall of the one p-type layer is collinear with a line that is collinear with a sidewall of the one n-type layer.

8. A method of forming a NAND unit cell, comprising:

forming a layer of tunnel dielectric material between a pair of vertical structures; the tunnel dielectric material layer forming an upward-opening container; the vertical structures comprising alternating layers of n-type doped semiconductor material and p-type doped semiconductor material;

forming a layer of charge-storage material within the container;

forming a layer of charge-blocking material within the container and over the layer of charge-storage material; the layers of charge-storage material and charge-blocking material narrowing the container and leaving an opening within the container; and forming alternating layers of electrically insulative material and electrically conductive material within the opening within the container; the layers of electrically conductive material forming a plurality of spaced apart control gate structures within the opening within the container which are incorporated into selecting devices of the NAND unit cell, wherein a first control gate structure of the plurality of control gate structures within the container is spaced from a second control gate structure of the plurality of control gate structures within the container that is immediately adjacent the first control gate structure only by the electrically insulative material and wherein the forming of the alternating layers of electrically insulative material and electrically conductive material comprises forming the first control gate structure above the layer of charge-blocking material and forming the second control gate structure above the first control gate structure.

9. The method of claim 8 wherein the forming the layer of tunnel dielectric material comprises:

deposition of the tunnel dielectric material over the pair of vertical structures and within a trench between the vertical structures; and planarization of the tunnel dielectric material to remove the tunnel dielectric material from over the pair of vertical structures.

10. The method of claim 8 wherein the forming the layer of tunnel dielectric material, charge-storage material, and charge-blocking material comprises:

deposition of the tunnel dielectric material over the pair of vertical structures and within a trench between the vertical structures;

deposition of the charge-storage material over the pair of vertical structures and within a trench between the vertical structures;

deposition of the charge-blocking material over the pair of vertical structures and within a trench between the vertical structures; and planarization of the tunnel dielectric material, charge-storage material, and charge-blocking material to remove the tunnel dielectric material, charge-storage material, and charge-blocking material from over the pair of vertical structures.

11. The method of claim 8 wherein the spaced apart control gate structures are formed to horizontally align with only the p-type doped semiconductor material so that the control gate structures do not overlap the layers of n-type doped semiconductor material.

12. The method of claim 8 wherein:
the layers of electrically conductive material are formed to extend laterally beyond the NAND unit cell;
a plurality of interconnects are formed to be in one-to-one correspondence with the layers of electrically conductive material;
the layers of conductive material form a series of steps at one lateral end, with steps progressively becoming more laterally inward in going from lower layers of conductive material to upper layers of conductive material to leave exposed platforms at said one lateral end of the layers of conductive material; and
the interconnects are formed to electrically contact the conductive layers at the exposed platforms.

* * * * *